United States Patent
Yoshii et al.

(10) Patent No.: US 11,933,865 B2
(45) Date of Patent: Mar. 19, 2024

(54) MAGNETIC FIELD MEASUREMENT APPARATUS AND MAGNETIC FIELD MEASUREMENT METHOD

(71) Applicants: SUMIDA CORPORATION, Tokyo (JP); Kyoto University, Kyoto (JP)

(72) Inventors: Yoshiharu Yoshii, Natori (JP); Masateru Hashimoto, Komoto (JP); Tsutomu Ootsuka, Natori (JP); Shingo Hamada, Natori (JP); Yuki Takemura, Kyoto (JP); Kan Hayashi, Kyoto (JP); Norikazu Mizuochi, Kyoto (JP)

(73) Assignees: SUMIDA CORPORATION (JP); Kyoto University (JP)

( * ) Notice: Subject to any disclaimer, the term of this patent is extended or adjusted under 35 U.S.C. 154(b) by 100 days.

(21) Appl. No.: 17/794,124

(22) PCT Filed: Feb. 18, 2021

(86) PCT No.: PCT/JP2021/006152
§ 371 (c)(1),
(2) Date: Jul. 20, 2022

(87) PCT Pub. No.: WO2021/172166
PCT Pub. Date: Sep. 2, 2021

(65) Prior Publication Data
US 2023/0051777 A1 Feb. 16, 2023

(30) Foreign Application Priority Data

Feb. 28, 2020 (JP) .................................. 2020-032685

(51) Int. Cl.
*G01R 33/24* (2006.01)

(52) U.S. Cl.
CPC .................................... *G01R 33/24* (2013.01)

(58) Field of Classification Search
CPC ....................................................... G01R 33/24
See application file for complete search history.

(56) References Cited

U.S. PATENT DOCUMENTS

| 9,632,045 B2 * | 4/2017 | Englund | G01N 21/6402 |
| 9,910,104 B2 * | 3/2018 | Boesch | G01R 33/032 |
| 2020/0132785 A1 * | 4/2020 | Yoshii | G01R 33/02 |

FOREIGN PATENT DOCUMENTS

JP 2012-110489 6/2012

* cited by examiner

*Primary Examiner* — Gregory H Curran

(57) ABSTRACT

A magnetic resonance member 1 includes a crystal structure and is capable of electron spin quantum operations with microwaves of different frequencies corresponding to arrangement orientations of a vacancy and an impurity in a crystal lattice. A magnetic field transmission unit 4 senses a measurement target magnetic field at plural measurement positions different from each other, and applies application magnetic fields corresponding to the measurement target magnetic field sensed at the plural measurement positions to the magnetic resonance member 1 along respective different directions corresponding to the aforementioned arrangement orientations. A measurement control unit 21 controls a high frequency power supply 12, and determines detection values detected by a detecting device (an irradiating device 5 and a light receiving device 6) of the physical phenomena corresponding to the plural measurement positions. A calculation unit 22 calculates the measurement target magnetic field at the plural measurement positions on the basis of the detection values.

7 Claims, 14 Drawing Sheets

FIG. 6
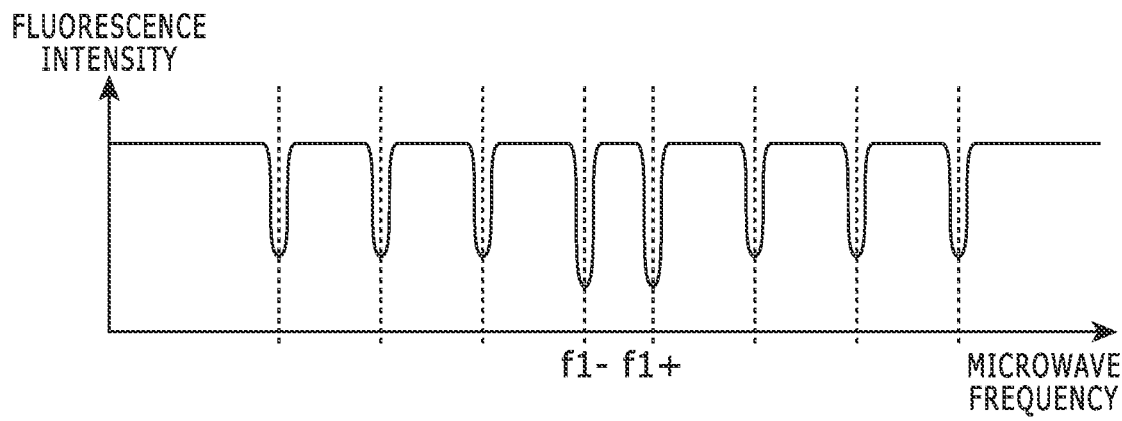
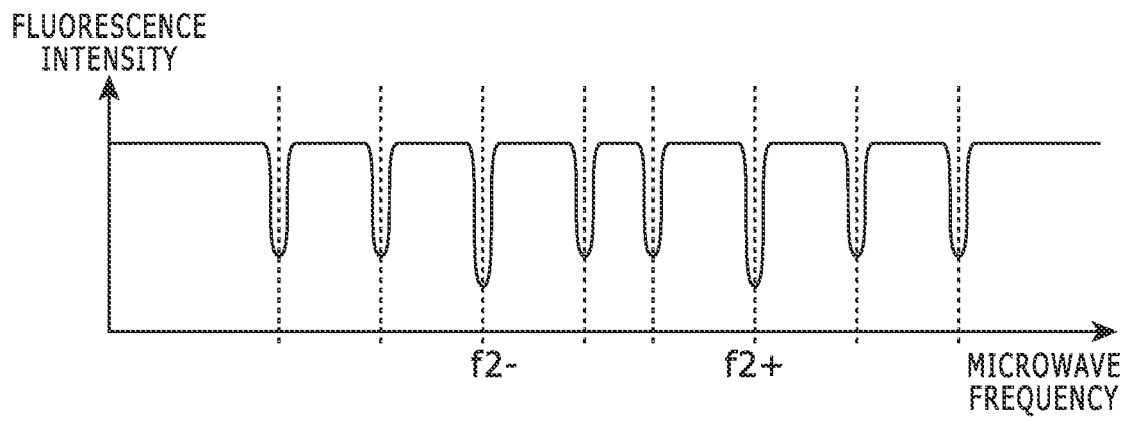
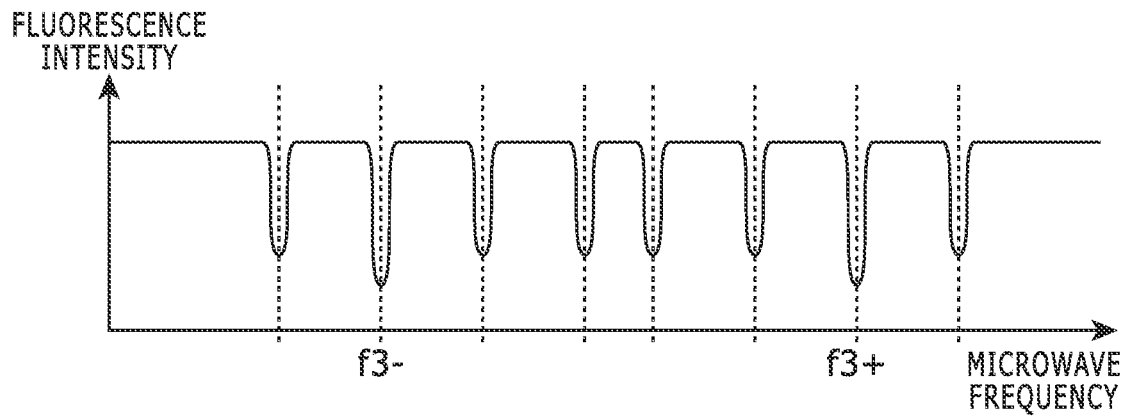

MAGNETIC FIELD MEASUREMENT APPARATUS AND MAGNETIC FIELD MEASUREMENT METHOD

TECHNICAL FIELD

The present invention relates to a magnetic field measurement apparatus and a magnetic field measurement method.

BACKGROUND ART

A magnetic measurement apparatus performs magnetic measurement with ODMR (Optically Detected Magnetic Resonance) that uses electron spin resonance (See Patent Literature #1, for example).

In ODMR, a magnetic resonance member that has sublevels and an optical transition level as energy level is simultaneously irradiated with a high-frequency magnetic field (microwave) and light, and thereby a population change or the like due to magnetic resonance between the sublevels is detected as an optical signal with high sensitivity. In general, after an electron in a ground state is excited with green light, the electron emits red light when returning to the ground state. For example, when an electron is irradiated with a high-frequency magnetic field of about 2.87 GHz in a nitrogen and a lattice defect in a diamond structure (NVC: Nitrogen Vacancy Center), the electron moves from the lowest level (spin magnetic quantum number $ms=0$) among three sublevels of the ground state to an energy level ($ms=+1$ or $-1$) higher than the lowest level among the three sublevels. When the electron in such state is irradiated with green light, an emitting light intensity is decreased because of no radiation transition to the lowest level ($ms=0$) among the three sublevels of the ground level; and therefore, it can be determined by detecting this light whether magnetic resonance occurs due to the high-frequency magnetic field. As mentioned, ODMR uses an optically detected magnetic resonance member such as a diamond including an NVC.

A measurement method of a DC (Direct Current) magnetic field using an NVC is performed in accordance with Ramsey Pulse Sequence. In Ramsey Pulse Sequence, (a) an NVC is irradiated with excitation light, (b) a first pi/2 pulse of a microwave is applied to the NVC, (c) a second pi/2 pulse of a microwave is applied to the NVC with a predetermined time interval tt from the first pi/2 pulse, (d) the NVC is irradiated with measurement light, and an emitted light intensity of the NVC is measured, and (e) a magnetic flux density is estimated on the basis of the measured intensity.

Further, a measurement method of an AC (Alternating Current) magnetic field using an NVC is performed in accordance with Spin Echo Pulse Sequence. In Spin Echo Pulse Sequence, (a) an NVC is irradiated with excitation light, (b) a first pi/2 pulse of a microwave is applied to the NVC at 0-degree phase of a measurement target magnetic field, (c) a pi pulse of a microwave is applied to the NVC at 180-degree phase of the measurement target magnetic field, (d) a second pi/2 pulse of a microwave is applied to the NVC at 360-degree phase of the measurement target magnetic field, (e) the NVC is irradiated with measurement light, and an emitted light intensity of the NVC is measured, and (f) a magnetic flux density is estimated on the basis of the measured intensity of the light.

CITATION LIST

Patent Literature

Patent Literature #1: Japan Patent Application Publication No. 2012-110489.

SUMMARY OF INVENTION

As mentioned, a magnetic field at a certain position can be measured in accordance with the aforementioned technique. However, if a magnetic field has to be measured in a lot of positions, magnetic sensor units are required of which the number is the same as the number of the measurement positions or it is required to move a magnetic sensor unit to scan a lot of measurement positions and measure a magnetic field at the measurement positions.

However, if magnetic sensor units are installed of which the number is the same as the number of the measurement positions, such magnetic sensor units result in a high cost of a measurement apparatus including them. Further, if a magnetic sensor unit is moved to scan measurement positions, a long scanning (moving) distance is required and thereby it takes long measurement time.

The present invention has been conceived in view of the aforementioned problem, and it is an object of the present invention to obtain a magnetic field measurement apparatus and a magnetic field measurement method of a relatively low cost and/or short measurement time.

A magnetic field measurement apparatus according to the present invention includes a magnetic resonance member that includes a crystal structure and capable of electron spin quantum operations with microwaves of different frequencies corresponding to arrangement orientations of a vacancy and an impurity in a crystal lattice; a high-frequency magnetic field generator that applies a magnetic field as a microwave to the magnetic resonance member; a high frequency power supply that causes the high-frequency magnetic field generator to conduct a current for the microwave; a magnetic field transmission unit that senses a measurement target magnetic field at plural measurement positions different from each other, and applies application magnetic fields corresponding to the measurement target magnetic field sensed at the plural measurement positions to the magnetic resonance member along respective different directions corresponding to the arrangement orientations; a detecting device that detects physical phenomena corresponding to the application magnetic fields using the magnetic resonance member; a measurement control unit that controls the high frequency power supply, and determines detection values detected by the detecting device of the physical phenomena corresponding to the plural measurement positions; and a calculation unit that calculates the measurement target magnetic field at the plural measurement positions on the basis of the detection values.

A magnetic field measurement method according to the present invention includes the steps of: (a) sensing a measurement target magnetic field at plural measurement position different from each other, and (b) applying application magnetic fields corresponding to the measurement target magnetic field sensed at the plural measurement positions to a magnetic resonance member along respective different directions corresponding to arrangement orientations of a vacancy and an impurity in a crystal lattice of the magnetic resonance member, the magnetic resonance member including a crystal structure and capable of electron spin quantum operations with microwaves of different frequencies corresponding to the arrangement orientations; detecting physical phenomena corresponding to the application magnetic fields using the magnetic resonance member, and determining detection values of the physical phenomena corresponding to the plural measurement positions; and calculating the measurement target magnetic field at the plural measurement positions on the basis of the detection values.

Advantageous Effect of Invention

By means of the present invention, obtained are a magnetic field measurement apparatus and a magnetic field measurement method of a relatively low cost and/or short measurement time.

BRIEF DESCRIPTION OF DRAWINGS

FIG. 6 shows a diagram that explains enhancement of fluorescence intensity change due to applying a static magnetic field Bo in the magnetic field measurement apparatus shown in FIG. 1;

DESCRIPTION OF EMBODIMENTS

Hereinafter, embodiments according to aspects of the present invention will be explained with reference to drawings.

Embodiment 1

Figure 1:
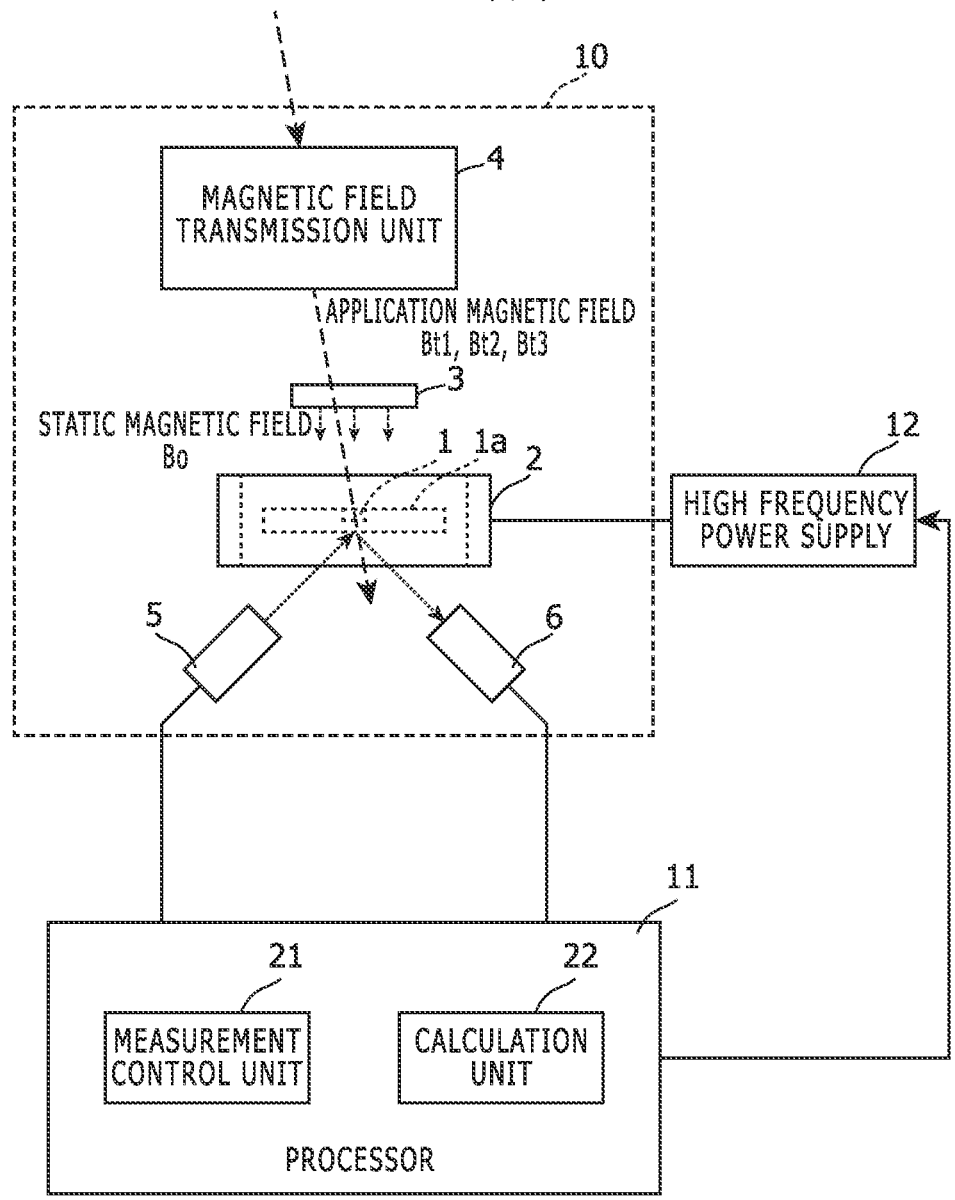
FIG. 1 shows a diagram that indicates a configuration of a magnetic field measurement apparatus according to an embodiment of the present invention.

FIG. 1 shows a diagram that indicates a configuration of a magnetic field measurement apparatus according to an embodiment of the present invention. The magnetic field measurement apparatus shown in FIG. 1 includes a magnetic sensor unit 10, a processor 11, and a high frequency power supply 12.

The magnetic sensor unit 10 detects a measurement target magnetic field (e.g. an intensity, a direction, and/or the like) at a predetermined position (e.g. on or over a surface of a test target object). The measurement target magnetic field may be an AC magnetic field of a single frequency or an AC magnetic field that includes plural frequency components and has a predetermined period.

In this embodiment, the magnetic sensor unit 10 includes a magnetic resonance member 1, a high-frequency magnetic field generator 2, a static magnetic field generating unit 3, and a magnetic field transmission unit 4.

The magnetic resonance member 1 includes a crystal structure and is capable of electron spin quantum operations (based on Rabi oscillation) with microwaves of different frequencies corresponding to arrangement orientations of a vacancy and an impurity in a crystal lattice.

In this embodiment, the magnetic resonance member 1 is an optically detected magnetic resonance member that includes plural specific color centers (i.e. color center ensemble). Each of the plural specific color centers has a Zeeman-splittable energy level and can take plural orientations (i.e. the aforementioned arrangement orientations) of which energy level shift amounts due to Zeeman splitting are different from each other.

Here the magnetic resonance member 1 is a board member such as a diamond including plural NV (Nitrogen Vacancy) centers as the specific color centers of a single type, and is fixed to a supporting member 1a. In the NV center, the ground level is a triplet level of Ms=0, +1, −1, and levels of Ms=+1 and Ms=−1 are Zeeman-splittable. Further, as mentioned below, in accordance with a positional relation between an atom (here, nitrogen) and a vacancy in a diamond crystal lattice, an NV center can take four orientations (i.e. arrangement orientations of a vacancy and an impurity) of which energy level shift amounts due to Zeeman splitting are different from each other. The magnetic resonance member 1 includes NV centers having plural (2, 3, or 4) orientations among the four orientations.

The high-frequency magnetic field generator 2 applies a microwave mentioned below to the magnetic resonance member 1. The high frequency power supply 12 generates a current for the microwave, and causes the high-frequency magnetic field generator 2 to conduct the current. For example, the high-frequency magnetic field generator 2 is a coil, an LC resonance device, a sort of a slit antenna or a rod antenna, or a combination of such devices.

The static magnetic field generating unit 3 applies a static magnetic field (DC magnetic field) that causes Zeeman splitting of the energy level of the plural specific color centers (here, plural NV centers) in the magnetic resonance member 1. A permanent magnet, a coil (i.e. electromagnet) or the like is used as the static magnetic field generating unit 3. If a coil is used as the static magnetic field generating unit 3, a DC power supply is installed and electrically connected to this coil, and supplies DC current and thereby the static magnetic field is generated.

The aforementioned plural specific color centers have orientations different from each other, and by the reference magnetic field, the energy level of the plural specific color centers is Zeeman-splitted with different energy level shift amounts corresponding to the plural orientations, respectively.

Figure 2:
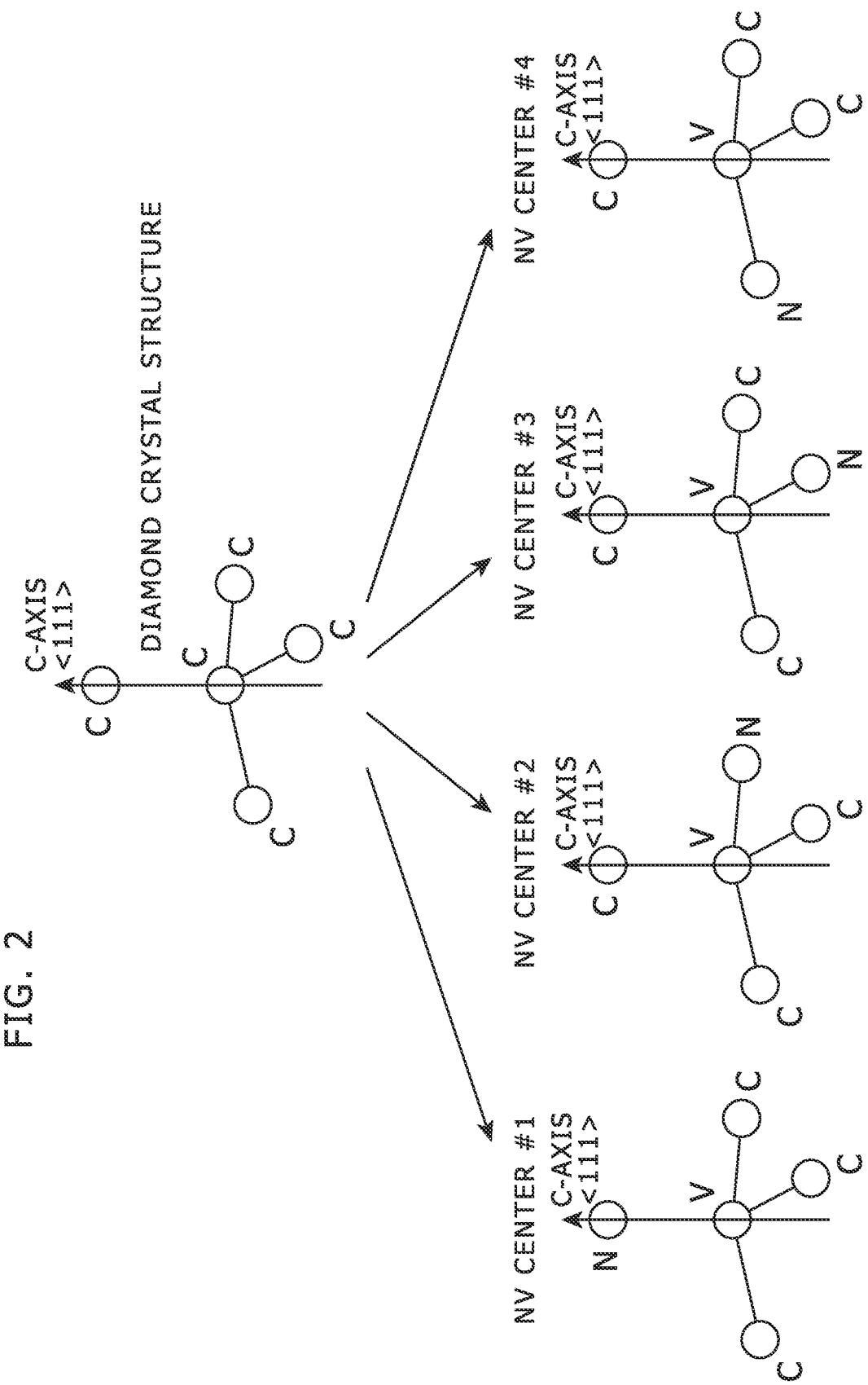
FIG. 2 shows a diagram that explains plural orientations of an NV center in a magnetic resonance member 1 shown in FIG. 1.
Figure 3:
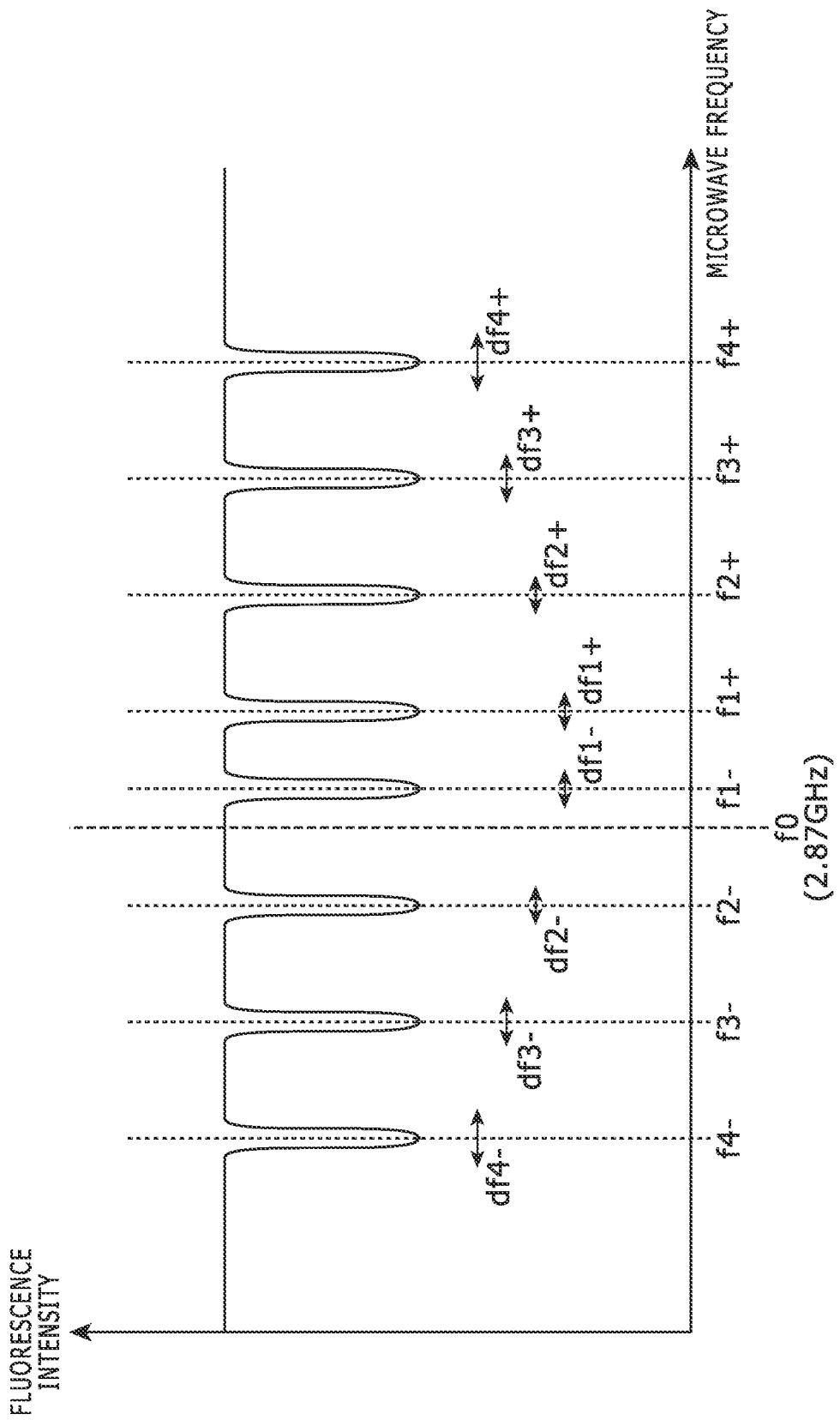
FIG. 3 shows a diagram that explains a frequency characteristic of a fluorescence intensity (characteristic of fluorescence intensities to microwave frequencies) corresponding to plural orientations of an NV center after Zeeman splitting of the NV center.

FIG. 2 shows a diagram that explains plural orientations of an NV center in a magnetic resonance member 1 shown in FIG. 1. FIG. 3 shows a diagram that explains a frequency characteristic of a fluorescence intensity (characteristic of fluorescence intensities to microwave frequencies) corresponding to plural orientations of an NV center after Zeeman splitting of the NV center.

As shown in FIG. 2, in a diamond crystal, a color center (i.e. NV center) is formed by a vacancy (hole) (V) and a nitrogen (N) as an impurity. The nitrogen (N) adjacent to the vacancy (hole) (V) in the diamond crystal is located at any of four possible positions (toward any of arrangement orientations of the vacancy and the nitrogen), and sub energy levels after Zeeman splitting (i.e. energy levels from the base energy level) corresponding to these positions (i.e. four arrangement orientation) are different from each other. Therefore, as shown in FIG. 3, in a characteristic of fluorescence intensities to frequencies of the microwave after Zeeman splitting due to the static magnetic field, dip frequency pairs (fi+, fi−) corresponding to the orientations i appear differently from each other. Thus, four dip frequency pairs (fi+, fi−) individually appear due to the static magnetic field Bo correspondingly to the aforementioned four orientations (arrangement orientations).

Figure 4:
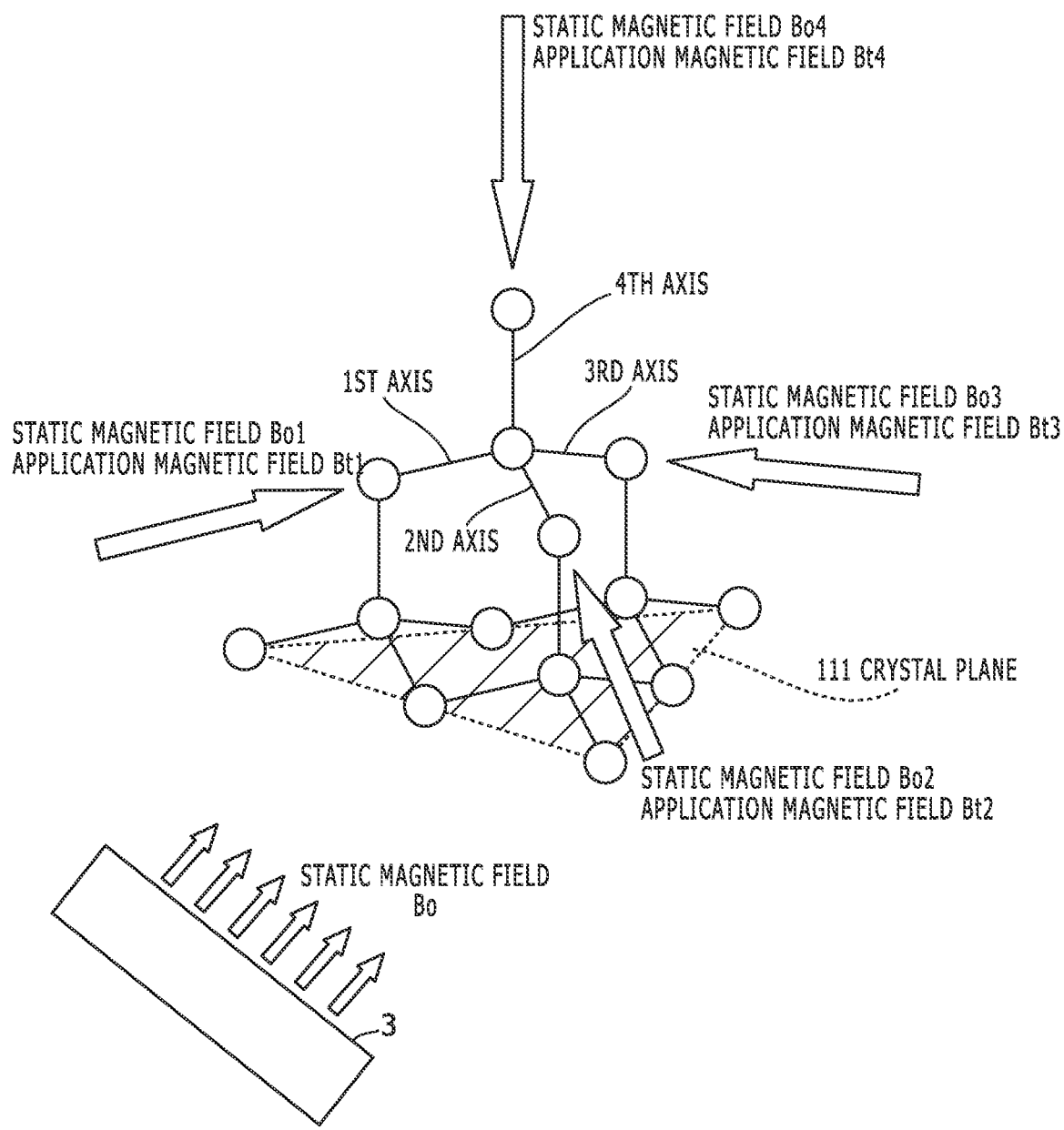
FIG. 4 shows a diagram that explains a direction of a magnetic field applied to the magnetic resonance member 1 by a magnetic field transmission unit 4 shown in FIG. 1.

FIG. 4 shows a diagram that explains a direction of a magnetic field applied to the magnetic resonance member 1 by a magnetic field transmission unit 4 shown in FIG. 1.

The magnetic field transmission unit 4 senses a measurement target magnetic field at plural measurement positions different from each other, and applies application magnetic fields corresponding to the measurement target magnetic field sensed at the plural measurement positions (i.e. magnetic fields transmitted from the measurement positions by the magnetic field transmission unit 4) to the magnetic resonance member 1 along respective different directions corresponding to the arrangement orientations.

For example, in a case shown in FIG. 4, the application magnetic fields Bt1, Bt2, Bt3, and Bt4 corresponding to the measurement target magnetic field sensed at four measurement positions are applied to the magnetic resonance member 1 along respective directions (directions of first axis, second axis, third axis, and fourth axis) different from each other corresponding to plural arrangement orientations of a vacancy and an impurity in a crystal lattice.

Further, the static magnetic field Bo is applied to the magnetic resonance member 1 along a direction that has different angles to the first, second, third, and fourth axes. Consequently, the static magnetic field Bo is resolved unequally (i.e. with different directions and different intensities) along the first, second, third, and fourth axes. The static magnetic field Bo is resolved to respective components Bo1, Bo2, Bo3, and Bo4 of the first, second, third, and fourth axes, and the static magnetic fields Bo1, Bo2, Bo3, and Bo4 as components of the first, second, third, and fourth axes are applied to the magnetic resonance member 1 along the first, second, third, and fourth axes, respectively. Here, a relationship |Bo1|<|Bo2|<|Bo3|<|Bo4| is satisfied.

Further, in FIG. 4, the static magnetic field generating unit 3 is depicted as a single member, but is not limited to it. The static magnetic field generating unit 3 may consist of plural members. For example, as mentioned below, coils or magnets may be arranged along the four axes, respectively. In such a case, if the four coils or magnets generate magnetic fields with different intensities, the static magnetic fields can be formed with different directions along the four axes and different intensities, as mentioned.

Further, as shown in FIG. 4, the magnetic field transmission unit 4 may be used for the four axes (i.e. as four channels) at the same time, and otherwise the magnetic field transmission unit 4 may be used for three axes among them (i.e. as three channels) or two axes among them (i.e. as two channels) at the same time.

Furthermore, specifically, in the magnetic field transmission unit 4, plural sensing parts that sense the measurement target magnetic field are arranged at plural measurement positions, and the magnetic field transmission unit 4 senses the measurement target magnetic field at these plural measurement positions. Furthermore, plural applying parts in the magnetic field transmission unit 4 are arranged and fixed such that the application magnetic fields are applied to the magnetic resonance member 1 along the corresponding arrangement orientations.

Figure 5:
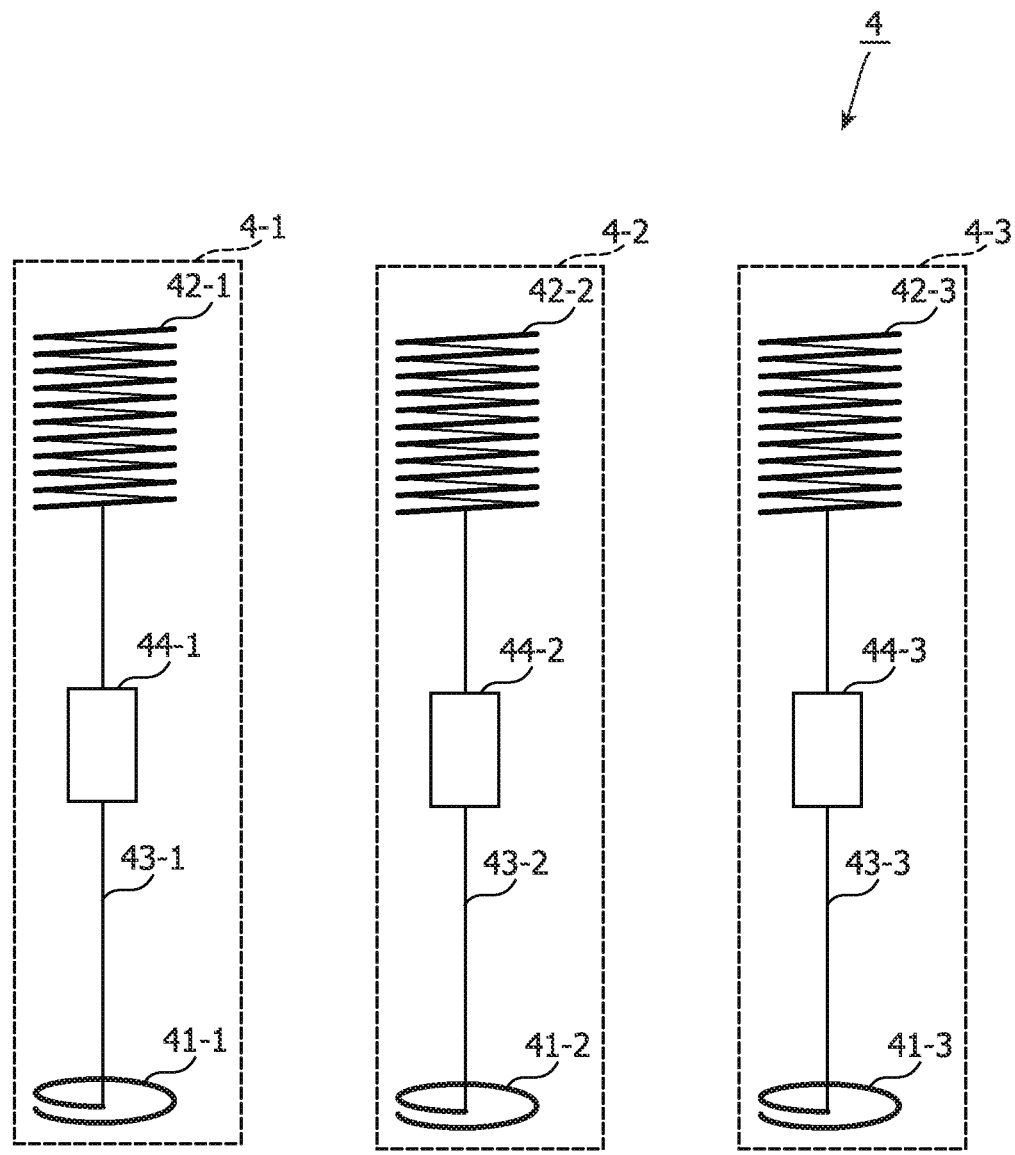
FIG. 5 shows a circuit diagram that indicates a configuration of the magnetic field transmission unit 4 in Embodiment 1.

FIG. 5 shows a circuit diagram that indicates a configuration of the magnetic field transmission unit 4 in Embodiment 1.

In this embodiment, the magnetic field transmission unit 4 includes flux transformers 4-1 to 4-*n* (here, n=2, 3, or 4) of which the number is the same as the number of the measurement positions, as shown in FIG. 5, for example. Each of the flux transformers 4-*i* (i=1, ..., n) includes a primary coil 41-*i*, a secondary coil 42-*i*, and a cable 43-*i* that electrically connects the primary coil 41-*i* and the secondary coil 42-*i*. Further, if required, the flux transformer 4-*i* includes a matching unit 44-*i* that restrains reflection or the like when the measurement target magnetic field has a high frequency. The primary coils 41-1 to 41-3 are the aforementioned sensing parts, and the secondary coils 42-1 to 42-3 are the aforementioned applying parts. The primary coil 41-*i* has one turn or few turns, and the secondary coil 42-*i* has more turns than turns of the primary coil 41-*i*. In this embodiment, the measurement target magnetic field sensed at the measurement position is converted to an electric signal by the primary coil 41-*i*, and this electric signal flows through the cable 43-*i* to the secondary coil 42-*i*, and thereby is converted to the application magnetic field. The cable 43-*i* is a coaxial cable, litz wires or the like.

The application magnetic fields correspond to magnetic fields at measurement positions of which the number is the same as the number of plural arrangement orientations (two, three or four arrangement orientations in case of an NV center) among the aforementioned four arrangement orientations, and are applied to the plural arrangement orientations, respectively; and by one magnetic sensor unit 10, magnetic fields (intensities, or intensities and directions of them) at these measurement positions are measured using microwaves of frequencies (dip frequencies) unique to the arrangement orientations. Therefore, the high frequency power supply 12 sets frequencies of the aforementioned microwaves as frequencies corresponding to a type of the magnetic resonance member 1 and the arrangement orientations (i.e. the dip frequencies corresponding to the arrangement orientations), and generates currents for the microwaves with the set frequencies.

As mentioned, the magnetic field transmission unit 4 senses the measurement magnetic field at plural measurement positions different from each other using the primary coils 41-1 to 41-n, and applies the application magnetic fields to the magnetic resonance member 1 along directions different from each other corresponding to arrangement orientations of a vacancy and an impurity in a crystal lattice using the secondary coils 42-1 to 42-n.

It should be noted that in this embodiment, as shown in FIG. 4, the static magnetic field Boi is applied along the arrangement orientation as a measurement target among the plural arrangement orientation together with the application magnetic field Bti (i=1, 2, 3). For example, the static magnetic field Boi may be applied by another coil along the same axis as an axis of the secondary coil 42-i. In such a case, there is an advantage that structure of them gets simple.

FIG. 6 shows a diagram that explains enhancement of fluorescence intensity change due to applying a static magnetic field Bo in the magnetic field measurement apparatus shown in FIG. 1. For example, if the static magnetic field Bo is applied along the arrangement orientation as shown in FIG. 4, then fluorescence intensity change at a dip frequency corresponding to the arrangement orientation is gained, and therefore the sensitivity gets high.

It should be noted that another color center that has plural orientations i as well may be used instead of the NV center as the aforementioned specific color center.

Figure 7:
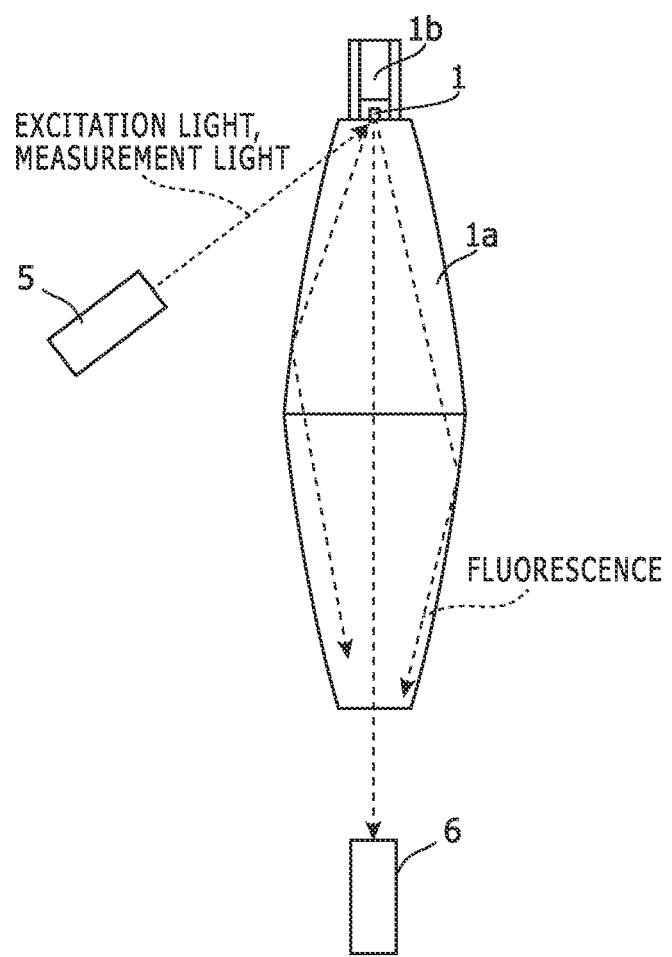
FIG. 7 shows a diagram that indicates an example of an optical system in the magnetic field measurement apparatus shown in FIG. 1.

Further, in this embodiment, the magnetic sensor unit 10 includes the irradiating device 5 and the light receiving device 6 as a detecting device that detects physical phenomena (here, fluorescence) corresponding to the application magnetic fields using the magnetic resonance member 1. The irradiating device 5 irradiates the magnetic resonance member 1 as an optically detected magnetic resonance member with light (excitation light of a predetermined wavelength and measurement light of a predetermined wavelength). The light receiving device 6 detects fluorescence emitted from the magnetic resonance member 1 when the magnetic resonance member 1 is irradiated with the measurement light. FIG. 7 shows a diagram that indicates an example of an optical system in the magnetic field measurement apparatus shown in FIG. 1. If an optically detected magnetic resonance member is used as the magnetic resonance member 1, an optical system as shown in FIG. 7 is used, for example. In this optical system, the supporting member 1a includes a pair of compound parabolic concentrators (CPCs). Large-diameter end surfaces of the two CPCs in the pair make contact with each other, and light (i.e. fluorescence emitted by the color center) enters through a small-diameter end surface of one of the CPCs and exits through a small-diameter end surface of the other of the CPCs. The fluorescence generated by the color center in the magnetic resonance member 1 passes through the supporting member 1a as mentioned, and enters the light receiving device 6. Further, the excitation light and the measurement light from the irradiating device 5 pass through the supporting member 1a, and the magnetic resonance member 1 is irradiated with them. For example, as shown in FIG. 7, a reflection member 1b may be arranged around the magnetic resonance member 1 such that the reflection member 1b reflects the excitation light and the measurement light and causes the excitation light and the measurement light to pass through the magnetic resonance member 1 predetermined times along a specific optical path.

It should be noted that here the physical phenomena are optically detected, but may be change of an electric characteristic (resistance value change of the magnetic resonance member 1 or the like) and may be electrically detected.

Returning to FIG. 1, the processor 11 includes a computer, for example, and executes a program with the computer and thereby acts as sorts of processing units. In this embodiment, the processor 11 saves signal data detected optically or electrically into an unshown storage device (memory or the like), and performs control and execution operations as a measurement control unit 21 and a calculation unit 22.

The measurement control unit 21 controls the high frequency power supply 12 and determines detection values of the physical phenomena (here, intensities of the fluorescence) corresponding to the aforementioned plural measurement positions, detected by the aforementioned detecting device (here, the irradiating device 5 and the light receiving device 6).

In this embodiment, the measurement control unit 21 controls the high frequency power supply 12 and the irradiating device 5 in accordance with a predetermined measurement sequence and thereby determines a detection light intensity of the fluorescence detected by the light receiving device 6. For example, the irradiating device 5 includes a laser diode or the like as a light source, and the light receiving device 6 includes a photo diode or the like as a photodetector, and the measurement control unit 21 determines the aforementioned detection light intensity on the basis of an output signal of the light receiving device 6, and this output signal is obtained by amplification and/or the like of an output signal of the photodetector.

The calculation unit 22 calculates the measurement target magnetic field at the aforementioned plural measurement positions on the basis of the detection values obtained by the measurement control unit 21 and saved in the storage device.

Further, in this embodiment, the measurement control unit 21 (a) controls the high frequency power supply 12 and the irradiating device 5 in accordance with a predetermined measurement sequence and determines a detection value of a physical phenomenon corresponding to one of the plural measurement positions, and (b) sequentially performs the measurement sequence plural times of which the number is the same as the number of plural measurement positions and determines the detection values of the physical phenomena corresponding to the plural measurement positions. Here, the measurement control unit 21 sets a microwave frequency of the high frequency power supply 12 (a frequency of current that flows through the high-frequency magnetic field generator 2) as a frequency corresponding to the measurement position (i.e. dip frequency corresponding to the arrangement orientation along which the application magnetic field corresponding to this measurement position is applied).

In this embodiment, this measurement sequence is set in accordance with a frequency or the like of the measurement target magnetic field. For example, if the measurement target magnetic field is a DC (direct current) magnetic field, a monotonically-increasing magnetic field with a relatively low rate, or a monotonically-decreasing magnetic field with a relatively low rate, Ramsey pulse sequence is applied as this measurement sequence; and if the measurement target magnetic field is an AC (alternating current) magnetic field of a relatively high frequency, a spin echo pulse sequence (Hahn echo sequence or the like) is applied as this measurement sequence. The measurement sequence is not limited to them.

For example, if the measurement target magnetic field is an AC (alternating current) magnetic field of a relatively low frequency, magnetic field measurement may be performed plural times in one period of the measurement target magnetic field in accordance with Ramsey pulse sequence (i.e. a measurement sequence for a DC magnetic field), and the measurement target magnetic field (intensities, waveform or the like of it) may be determined on the basis of magnetic field measurement results.

Figure 8:
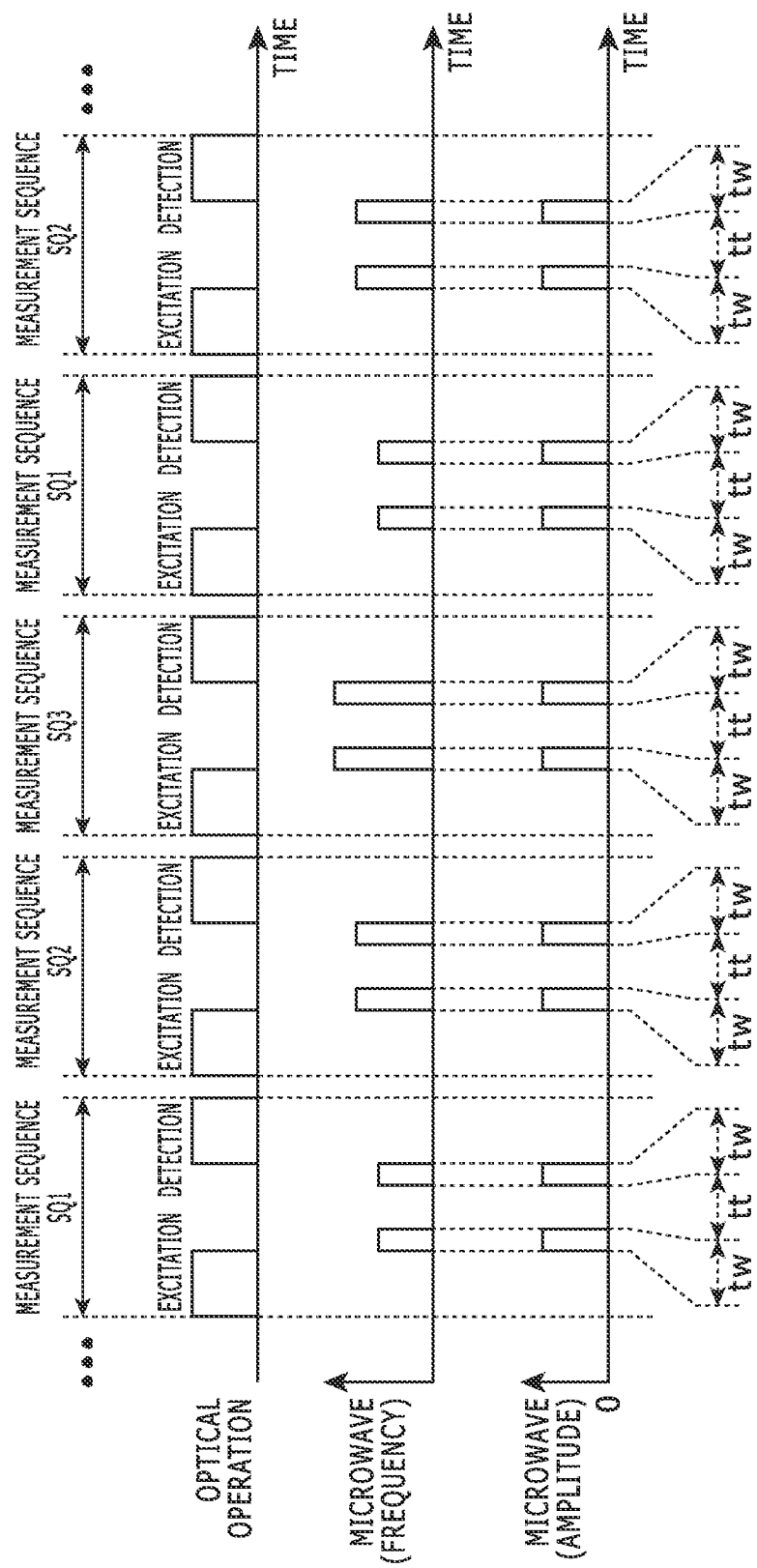
FIG. 8 shows a timing chart that explains magnetic field measurement performed in accordance with Ramsey Pulse Sequence in the magnetic field measurement apparatus shown in FIG. 1.
Figure 9:
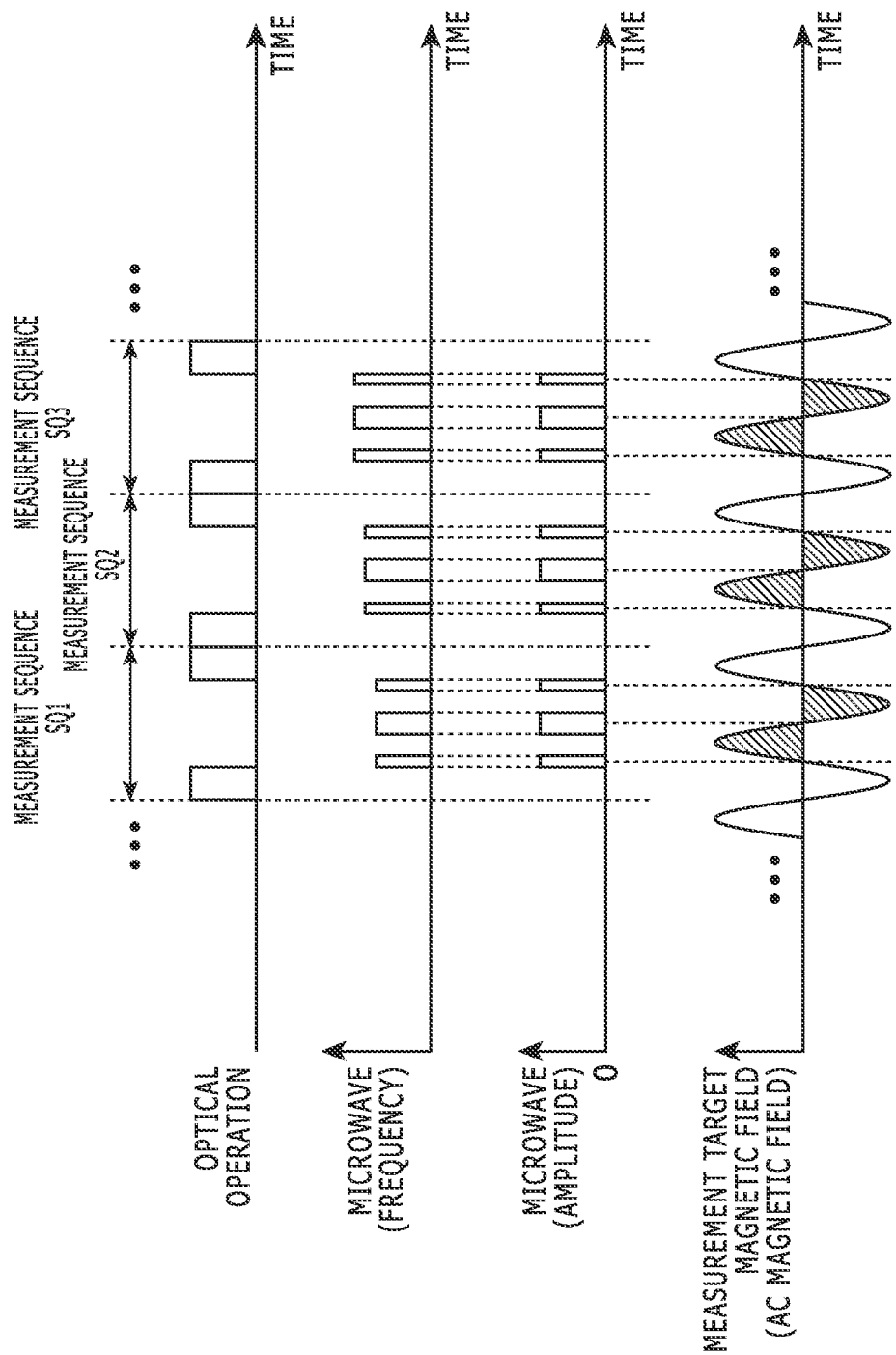
FIG. 9 shows a timing chart that explains magnetic field measurement performed in accordance with Spin Echo Pulse Sequence in the magnetic field measurement apparatus shown in FIG. 1.

FIG. 8 shows a timing chart that explains magnetic field measurement performed in accordance with Ramsey Pulse Sequence in the magnetic field measurement apparatus shown in FIG. 1. FIG. 9 shows a timing chart that explains magnetic field measurement performed in accordance with Spin Echo Pulse Sequence in the magnetic field measurement apparatus shown in FIG. 1.

For example, if magnetic field measurement is performed at three measurement positions (with the sensing parts) corresponding to three arrangement orientations of an NV center, corresponding three measurement sequences SQ1, SQ2, and SQ3 are repeatedly performed in a time divisional manner as shown in FIG. 8 or 9, for example (or with a predetermined time interval). As shown in FIGS. 8 and 9, in the measurement sequence SQi, the microwave frequency is set correspondingly to the arrangement orientation i.

As shown in FIG. 9, the measurement of the measurement target magnetic field (i.e. a hatched part in the waveform shown in FIG. 9) is performed with a time interval of the predetermined number of periods (in FIG. 9, one period). A time interval between the first pi/2 pulse and the pi pulse and a time interval between the pi pulse and the second pi/2 pulse may be shortened in order to complete one measurement sequence SQi including optical operations in one period of the measurement target magnetic field, and thereby the measurement of the measurement target magnetic field may be sequentially performed in continuous periods.

In this embodiment, the magnetic sensor unit 10 is moved for scanning, and thereby the magnetic field measurement is performed at plural positions on a scanning path while moving the aforementioned plural measurement positions.

Figure 10:
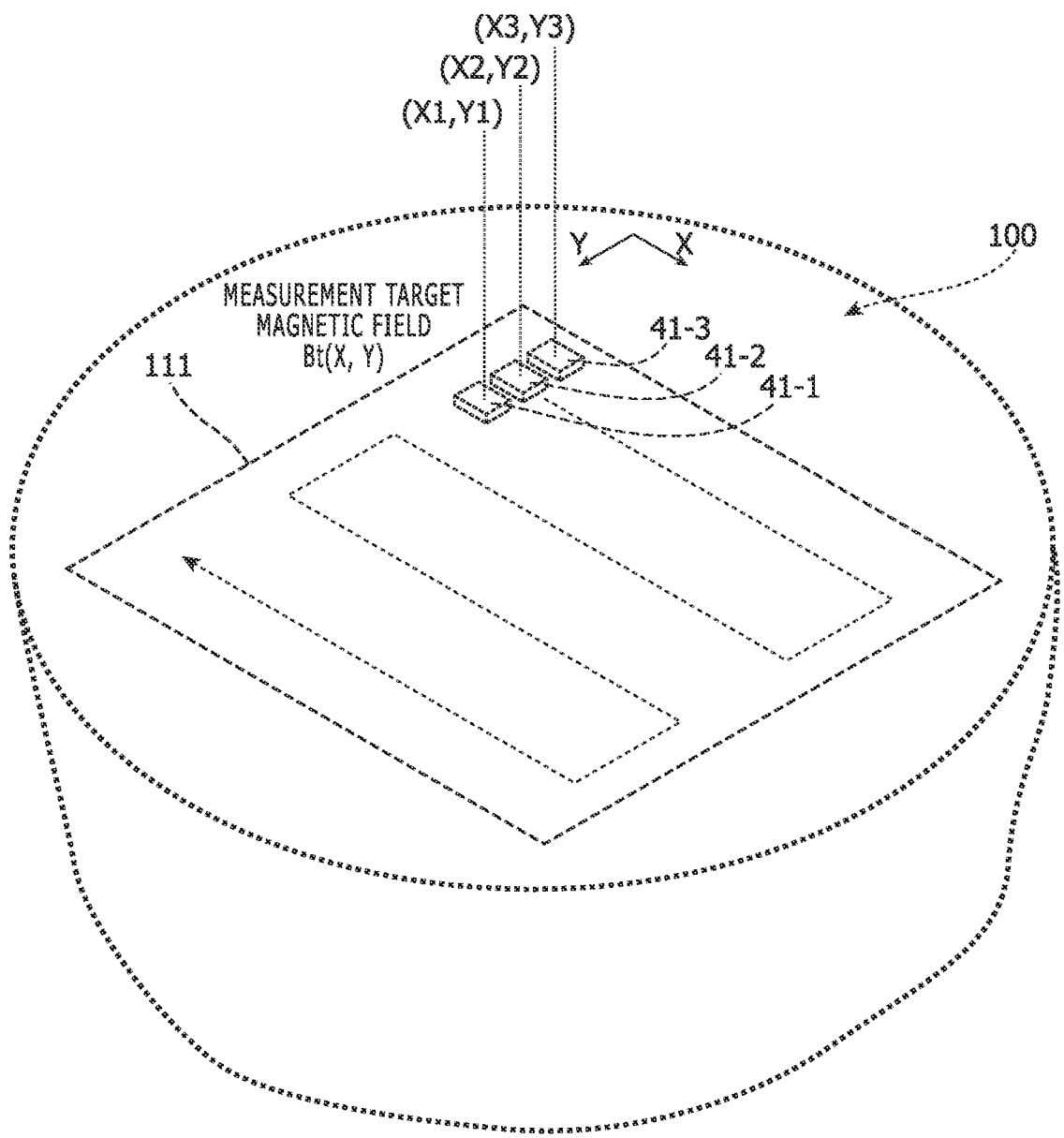
FIG. 10 shows a perspective view diagram that explains scanning of a magnetic sensor unit 10 shown in FIG. 1.

FIG. 10 shows a perspective view diagram that explains scanning of a magnetic sensor unit 10 shown in FIG. 1. The measurement control unit 21 controls a driving device such as an unshown slider, and moves the primary side of the magnetic field transmission unit 4 in the magnetic sensor unit 10 (i.e. the sensing parts that sense the measurement target magnetic field, here the primary coils 41-1 to 41-3) for scanning, for example, as shown in FIG. 10, on a planer measurement area 111 in two dimensional directions (X direction and Y direction) of a surface of a test target object 100, and thereby moves a measurement position (Xi, Yi) of the primary coil 41-*i* of each flux transformer 4-*i*, and performs magnetic field measurement using the magnetic sensor unit 10 at predetermined plural positions on a scanning path. A pattern of the scanning path of the magnetic sensor unit 10 is not limited to that shown in FIG. 10.

The magnetic sensor unit 10 may not be moved for scanning and may perform the magnetic field measurement at the aforementioned plural measurement positions as fixed positions.

Further, a magnetic shield is installed around the magnetic resonance member 1 of the magnetic sensor unit 10 such that a magnetic field in the test target object 100 side (e.g. a magnetic field applied to the test target object 100) is not directly applied to the magnetic resonance member 1.

The following part explains a behavior of the magnetic field measurement apparatus in Embodiment 1.

The magnetic sensor unit 10 is arranged such that the plural sensing parts of the magnetic field transmission unit 4 are arranged at plural measurement positions of a test target object 100 or the like.

Subsequently, at the plural measurement positions, as shown in FIGS. 8 and 9, for example, the measurement control unit 21 sequentially sets a frequency of a microwave applied by the high-frequency magnetic field generator 2 and an application direction of the static magnetic field so as to correspond to a measurement position, and performs the aforementioned measurement sequence SQi, and thereby obtains detection values (here, fluorescence intensities) of the physical phenomena of the magnetic resonance member 1 from the magnetic sensor unit 10; and the calculation unit 22 determines a magnetic field (intensities, directions and/or the like) at the plural measurement positions on the basis of the detection values.

Thus, by the single magnetic sensor unit 10 (i.e. the single magnetic resonance member 1), a magnetic field is measured at plural measurement positions.

Subsequently, if the magnetic sensor unit 10 is moved for scanning, the measurement control unit 21 moves the magnetic sensor unit 10 along the predetermined scanning path pattern and thereby arranges the sensing parts at next plural measurement positions on the scanning path, and as well, performs the aforementioned measurement sequence SQi, and thereby obtains detection values (here, fluorescence intensities) of the physical phenomena of the magnetic resonance member 1 from the magnetic sensor unit 10; and the calculation unit 22 determines a magnetic field (intensities, directions and/or the like) at the plural measurement positions on the basis of the detection values.

Contrarily, if the magnetic sensor unit 10 is not moved for scanning, at a next measurement time point if required, at the same plural measurement positions, as well, the measurement control unit 21 performs the aforementioned measurement sequence SQi, and thereby obtains detection values (here, fluorescence intensities) of the physical phenomena of the magnetic resonance member 1 from the magnetic sensor unit 10; and the calculation unit 22 determines a magnetic field (intensities, directions and/or the like) at the plural measurement positions on the basis of the detection values.

As mentioned, in Embodiment 1, the magnetic resonance member 1 includes a crystal structure and is capable of electron spin quantum operations with microwaves of different frequencies corresponding to arrangement orientations of a vacancy and an impurity in a crystal lattice. The high-frequency magnetic field generator 2 applies a magnetic field of a microwave to the magnetic resonance member 1. The high frequency power supply 12 causes the high-frequency magnetic field generator 2 to conduct a current for the microwave. The magnetic field transmission unit 4 senses a measurement target magnetic field at plural measurement positions different from each other, and applies application magnetic fields corresponding to the measurement target magnetic field sensed at the plural measurement positions to the magnetic resonance member 1 along respective different directions corresponding to the aforementioned arrangement orientations. The detecting device (the irradiating device 5 and the light receiving device 6) detects physical phenomena corresponding to the application magnetic fields using the magnetic resonance member 1. The measurement control unit 21 controls the high frequency power supply 12, and determines detection values detected by the detecting device of the physical phenomena corresponding to the plural measurement positions. The calculation unit 22 calculates the measurement target magnetic field at the plural measurement positions on the basis of the detection values.

Consequently, magnetic field measurement at plural measurement positions is collectively performed by the single magnetic sensor unit 10 (i.e. the single magnetic resonance member 1), and thereby, the single magnetic sensor unit 10 performs multi-channel sensing. Therefore, obtained are a magnetic field measurement apparatus and a magnetic field measurement method of a relatively low cost and/or short measurement time. Thus, if the magnetic sensor unit 10 is moved for scanning, a scanning distance and measurement time get short because magnetic field measurement at plural measurement positions is collectively performed. If the magnetic sensor unit 10 is not moved for scanning and is fixed, the number of the magnetic sensor unit 10 is small and magnetic field measurement is performed at a relatively low cost because magnetic field measurement at plural measurement positions is collectively performed.

Embodiment 2

Figure 11:
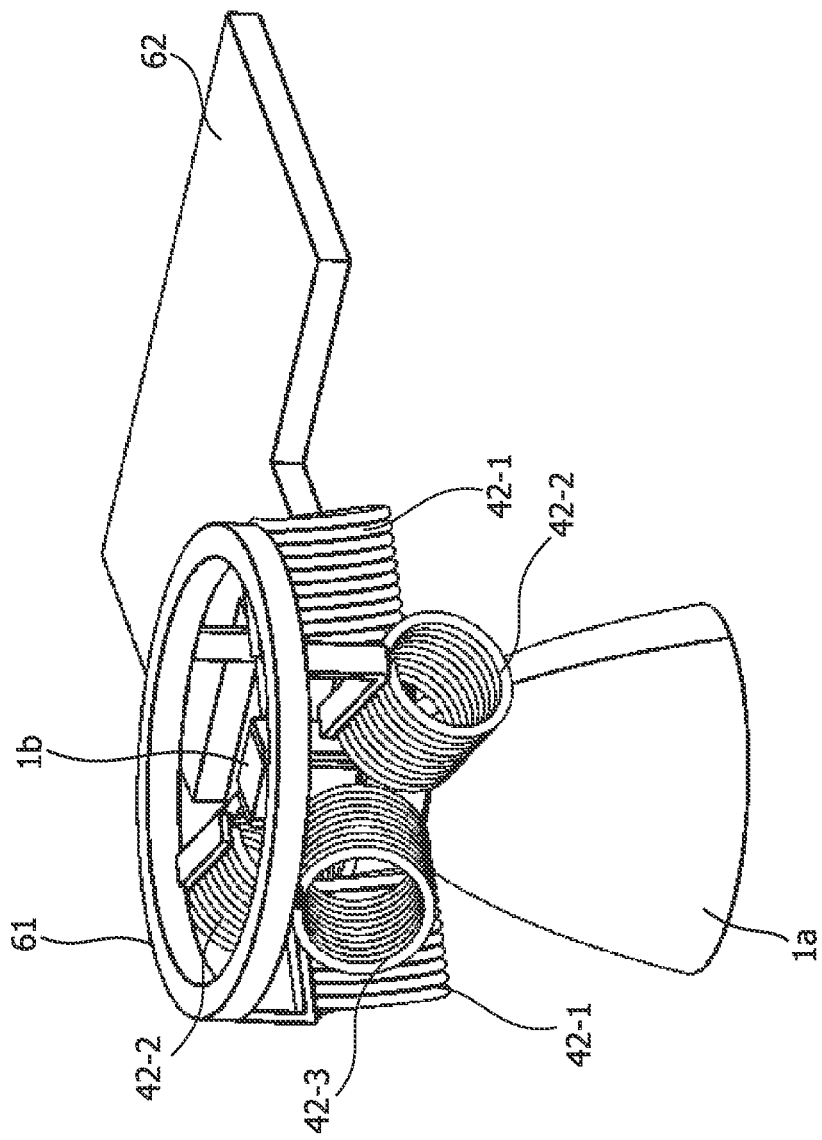
FIG. 11 shows a perspective view diagram that explains an example of arrangement of secondary coils 42-1 to 42-3 in the magnetic field transmission unit 4 in the magnetic field measurement apparatus according to Embodiment 2.

FIG. 11 shows a perspective view diagram that explains an example of arrangement of secondary coils 42-1 to 42-3 in the magnetic field transmission unit 4 in the magnetic field measurement apparatus according to Embodiment 2. In Embodiment 2, three arrangement orientations are used among the four arrangement orientations of the NV center.

In Embodiment 2, as shown in FIG. 11 for example, for one of the arrangement orientations, two secondary coils 42-i are arranged such that the magnetic resonance member 1 is arranged between these two secondary coils 42-i; and the application magnetic field is applied to the magnetic resonance member 1 along this arrangement orientation by these two secondary coils 42-i. As shown in FIG. 11 for example, three pairs of the secondary coils 42-i are fixed to a non-magnetic supporting member 61 along the arrangement orientations, respectively, and the supporting member 61 is fixed to a substrate 62 or the like. The high frequency power supply 12 and the like are installed on the substrate 62 and the high-frequency magnetic field generator 2 and the like are fixed to the substrate 62. Meanwhile, in FIG. 11, an only upper half of the supporting member 1a is depicted. Further, a source of the static magnetic field Boi (not shown) may be a magnet, a magnetic device, a coil or the like as another member, and is arranged at a position over the magnetic resonance member 1 or both positions over and under the magnetic resonance member 1.

Other parts of the configuration and behaviors of the magnetic field measurement apparatus in Embodiment 2 are identical or similar to those in Embodiment 1, and therefore not explained here.

Embodiment 3

Figure 12:
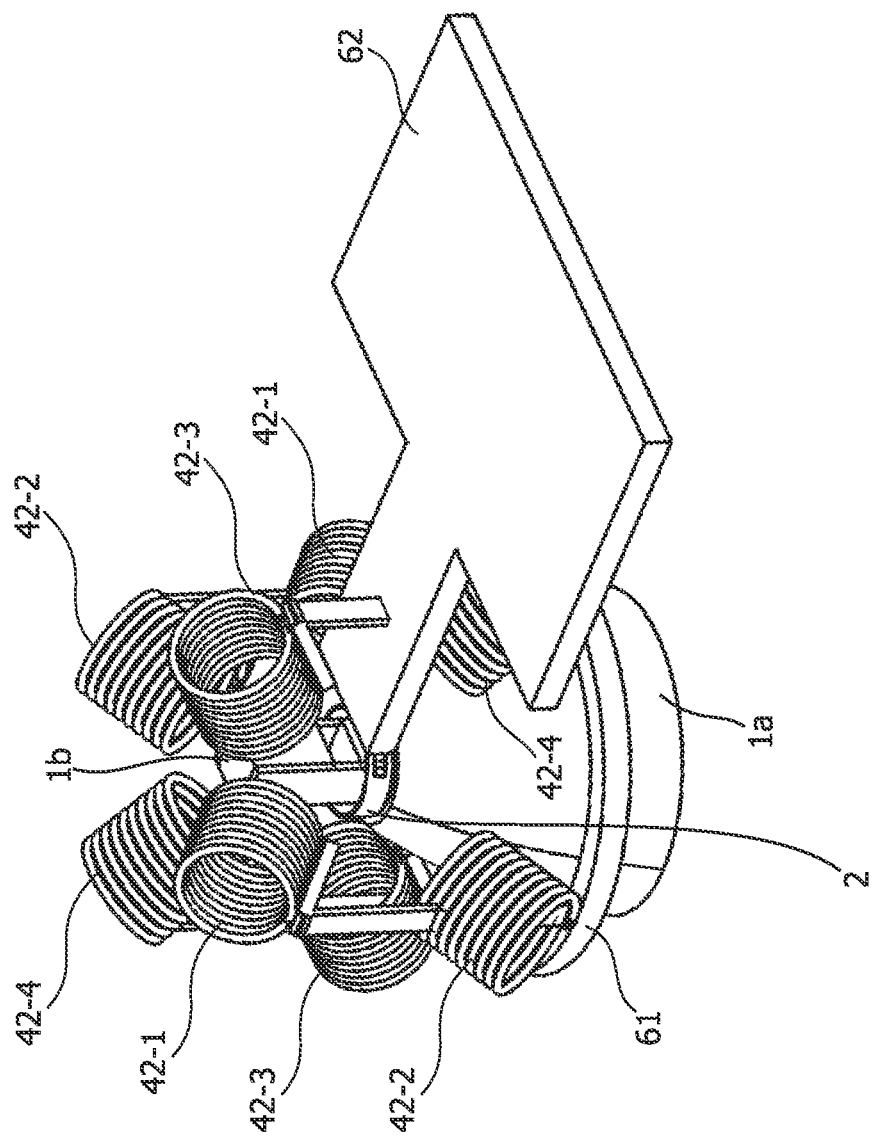
FIG. 12 shows a perspective view diagram that explains an example of arrangement of secondary coils 42-1 to 42-4 in the magnetic field transmission unit 4 in the magnetic field measurement apparatus according to Embodiment 3.

FIG. 12 shows a perspective view diagram that explains an example of arrangement of secondary coils 42-1 to 42-4 in the magnetic field transmission unit 4 in the magnetic field measurement apparatus according to Embodiment 3. In Embodiment 3, four (all) arrangement orientations are used among the four arrangement orientations of the NV center.

In Embodiment 3, another flux transformer for the fourth axis is further installed, as well as in Embodiment 2, four pairs of the secondary coils 42-1 to 42-4 are fixed to the supporting member 61, and are arranged along the four arrangement orientations of the NV center in the magnetic resonance member 1. Here, the secondary coil 42-4 is a secondary coil of the flux transformer for the fourth axis.

Further, in FIG. 12, an only upper half of the supporting member 1a is depicted. Furthermore, a source of the static magnetic field Boi (not shown) may be a magnet, a magnetic device, a coil (e.g. Helmholtz coil) or the like as another member, and is arranged at a position outside of four axes of the secondary coils 42-1 to 42-4 for the magnetic resonance member 1.

Other parts of the configuration and behaviors of the magnetic field measurement apparatus in Embodiment 3 are identical or similar to those in Embodiment 1 or 2, and therefore not explained here.

Embodiment 4

Figure 13:
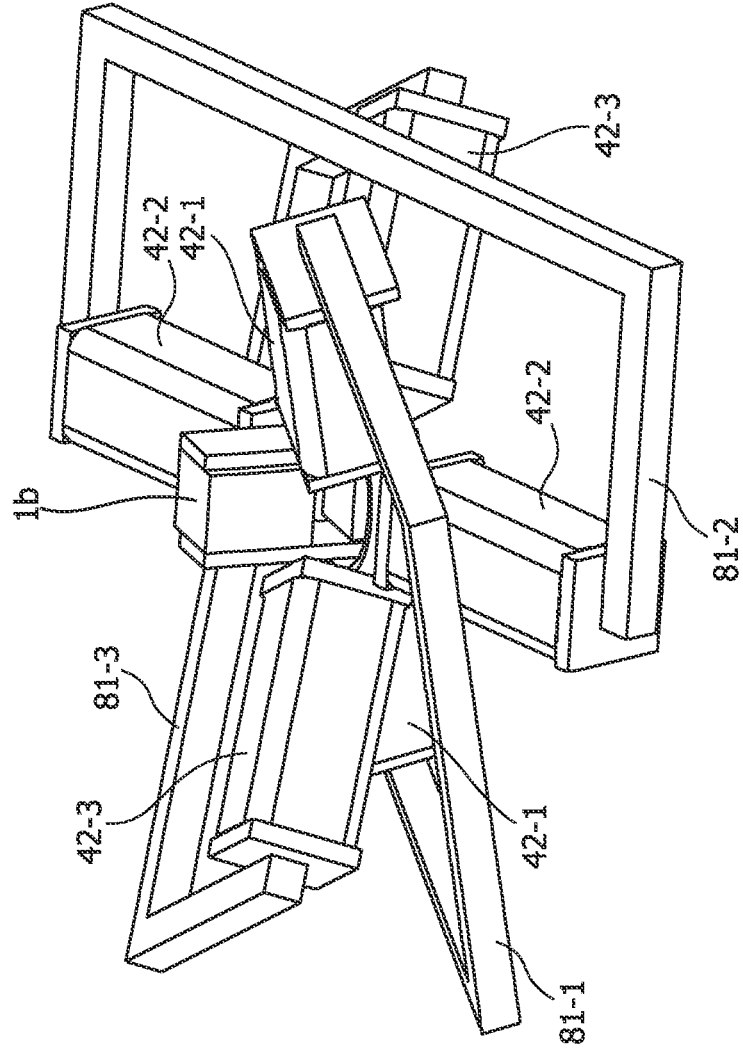
FIG. 13 shows a perspective view diagram that explains an example of arrangement of secondary coils 42-1 to 42-3 in the magnetic field transmission unit 4 in the magnetic field measurement apparatus according to Embodiment 4.

FIG. 13 shows a perspective view diagram that explains an example (corresponding to FIG. 4) of arrangement of secondary coils 42-1 to 42-3 in the magnetic field transmission unit 4 in the magnetic field measurement apparatus according to Embodiment 4. In Embodiment 4, for each arrangement orientation i, a pair (two) of the secondary coils 41-i is used and a magnetic core 81-i is installed. Further, as shown in FIG. 13, the secondary coils 41-i are arranged in end parts of the magnetic core 81-i (i.e. so as to be adjacent to a gap of the core). The magnetic core 81-i is a C-shaped core with one gap, and extends through the secondary coils 41-i (specifically, bobbins around which the secondary coils 41-i are wound) and forms a magnetic path of the application magnetic field generated by the secondary coils 41-i. In the gap, the magnetic resonance member 1 is arranged, and the application magnetic field generated by the secondary coils 41-i is applied to the magnetic resonance member 1 along the corresponding arrangement orientation through the magnetic core 81-i. Further, a source of the static magnetic field Boi (not shown) may be a magnet, a magnetic device, a coil or the like as another member, and is arranged at a position over the magnetic resonance member 1 or both positions over and under the magnetic resonance member 1.

Other parts of the configuration and behaviors of the magnetic field measurement apparatus in Embodiment 4 are identical or similar to those in any of Embodiments 1 to 3, and therefore not explained here.

Embodiment 5

Figure 14:
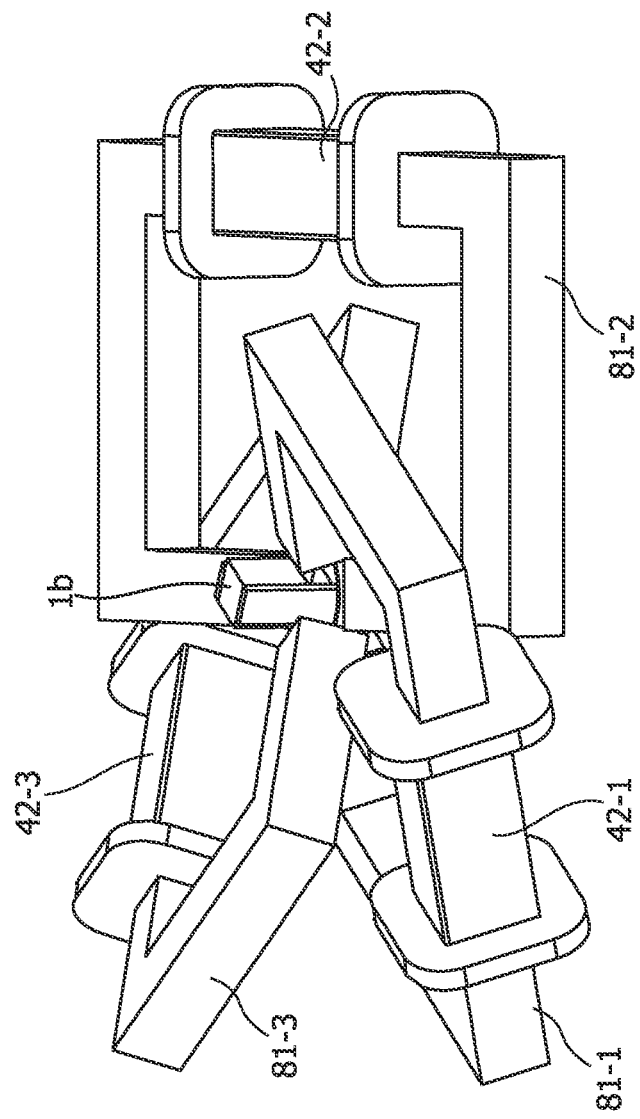
FIG. 14 shows a perspective view diagram that explains an example of arrangement of secondary coils 42-1 to 42-3 in the magnetic field transmission unit 4 in the magnetic field measurement apparatus according to Embodiment 5.

FIG. 14 shows a perspective view diagram that explains an example of arrangement of secondary coils 42-1 to 42-3 in the magnetic field transmission unit 4 in the magnetic field measurement apparatus according to Embodiment 5. In Embodiment 5, for each arrangement orientation i, a single secondary coil 41-i is used and the magnetic core 81-i is installed. As well as in Embodiment 4, the magnetic core 81-i is a C-shaped core with one gap, and extends through the secondary coil 41-i (specifically, a bobbin around which the secondary coil 41-i is wound) and forms a magnetic path of the application magnetic field generated by the secondary coils 41-i. In the gap, the magnetic resonance member 1 is arranged, and the application magnetic field generated by the secondary coil 41-i is applied to the magnetic resonance member 1 along the corresponding arrangement orientation through the magnetic core 81-i.

Other parts of the configuration and behaviors of the magnetic field measurement apparatus in Embodiment 5 are identical or similar to those in any of Embodiments 1 to 4, and therefore not explained here.

Embodiment 6

In a magnetic field measurement apparatus of Embodiment 6, magnetic path members (magnetic cores) are used instead of the flux transformers 4-*i*. In Embodiment 6, the magnetic path members form plural magnetic paths from plural measurement positions to the magnetic resonance member 1. Ends of the magnetic path members act as the sensing parts, and the other ends of the magnetic path members act as the applying parts.

Other parts of the configuration and behaviors of the magnetic field measurement apparatus in Embodiment 6 are identical or similar to those in any of Embodiments 1 to 5, and therefore not explained here.

Embodiment 7

In a magnetic field measurement apparatus of Embodiment 7, at each of the plural measurement positions (e.g. 2 positions), two sensing parts are arranged in different directions (e.g. X axis direction and Y axis direction) to sense magnetic fields in X axis direction and in Y axis direction, and by performing vector synthesis for measurement results of them, an intensity and a direction of the magnetic field is determined at each of the plural measurement positions.

Other parts of the configuration and behaviors of the magnetic field measurement apparatus in Embodiment 7 are identical or similar to those in any of Embodiments 1 to 6, and therefore not explained here.

Further, it should be understood that various changes and modifications to the aforementioned Embodiments 1 to 7 described herein will be apparent to those skilled in the art. Such changes and modifications may be made without departing from the spirit and scope of the present subject matter and without diminishing its intended advantages. It is therefore intended that such changes and modifications be covered by the appended claims.

For example, in the aforementioned Embodiments 1 to 7, as an example, a waveform of the measurement target AC magnetic field is assumed as a sine wave (FIG. 9). Alternatively, a waveform of the measurement target AC magnetic field may be another waveform (e.g. triangle wave, sawtooth wave, square wave, synthesized wave of plural waveforms, or the like).

Further, in the aforementioned Embodiments 1 to 7, the aforementioned plural measurement positions (i.e. arrangement of the sensing parts) may not be arranged in line. Furthermore, in the aforementioned embodiments, the aforementioned plural measurement positions (i.e. arrangement of the sensing parts) may not be arranged on a single plane but may be arranged three-dimensionally. Furthermore, in the aforementioned embodiments, the aforementioned plural measurement positions (i.e. arrangement of the sensing parts) may be arranged on a curve line or a curved surface.

INDUSTRIAL APPLICABILITY

For example, the present invention is applicable to a magnetic field measurement apparatus and a magnetic field measurement method.

The invention claimed is:

1. A magnetic field measurement apparatus, comprising:
a magnetic resonance member that includes a crystal structure and capable of electron spin quantum operations with microwaves of different frequencies corresponding to arrangement orientations of a vacancy and an impurity in a crystal lattice;
a high-frequency magnetic field generator that applies a magnetic field as a microwave to the magnetic resonance member;
a high frequency power supply that causes the high-frequency magnetic field generator to conduct a current for the microwave;
a magnetic field transmission unit that senses a measurement target magnetic field at plural measurement positions different from each other, and applies application magnetic fields corresponding to the measurement target magnetic field sensed at the plural measurement positions to the magnetic resonance member along respective different directions corresponding to the arrangement orientations;
a detecting device that detects physical phenomena corresponding to the application magnetic fields using the magnetic resonance member;
a measurement control unit that controls the high frequency power supply, and determines detection values detected by the detecting device of the physical phenomena corresponding to the plural measurement positions; and
a calculation unit that calculates the measurement target magnetic field at the plural measurement positions on the basis of the detection values.

2. The magnetic field measurement apparatus according to claim 1, wherein the measurement control unit (a) controls the high frequency power supply in accordance with a predetermined measurement sequence and determines a detection value of a physical phenomenon corresponding to one of the plural measurement positions, and (b) sequentially performs the measurement sequence plural times of which the number is the same as the number of plural measurement positions and determines the detection values of the physical phenomena corresponding to the plural measurement positions.

3. The magnetic field measurement apparatus according to claim 2, wherein the measurement control unit sets frequencies of currents of the high frequency power supply in the measurement sequence as frequencies corresponding to the measurement positions.

4. The magnetic field measurement apparatus according to claim 1, wherein the magnetic field transmission unit is a flux transformer that includes primary coils and secondary coils, senses the measurement target magnetic field at the plural measurement positions different from each other using the primary coils and applies the application magnetic fields to the magnetic resonance member using the secondary coils, along respective different directions corresponding to the arrangement orientations.

5. The magnetic field measurement apparatus according to claim 2, wherein the magnetic field transmission unit is a flux transformer that includes primary coils and secondary coils, senses the measurement target magnetic field at the plural measurement positions different from each other using the primary coils and applies the application magnetic fields to the magnetic resonance member using the secondary coils, along respective different directions corresponding to the arrangement orientations.

6. The magnetic field measurement apparatus according to claim 3, wherein the magnetic field transmission unit is a flux transformer that includes primary coils and secondary coils, senses the measurement target magnetic field at the plural measurement positions different from each other using the primary coils and applies the application magnetic fields to the magnetic resonance member using the secondary coils, along respective different directions corresponding to the arrangement orientations.

7. A magnetic field measurement method, comprising the steps of:
- (a) sensing a measurement target magnetic field at plural measurement position different from each other, and (b) applying application magnetic fields corresponding to the measurement target magnetic field sensed at the plural measurement positions to a magnetic resonance member along respective different directions corresponding to arrangement orientations of a vacancy and an impurity in a crystal lattice of the magnetic resonance member, the magnetic resonance member including a crystal structure and capable of electron spin quantum operations with microwaves of different frequencies corresponding to the arrangement orientations;
- detecting physical phenomena corresponding to the application magnetic fields using the magnetic resonance member, and determining detection values of the physical phenomena corresponding to the plural measurement positions; and
- calculating the measurement target magnetic field at the plural measurement positions on the basis of the detection values.

* * * * *